(12) United States Patent
Tamura

(10) Patent No.: US 11,823,938 B2
(45) Date of Patent: Nov. 21, 2023

(54) MOUNTING DEVICE AND MOUNTING METHOD

(71) Applicant: TORAY ENGINEERING CO., LTD., Tokyo (JP)

(72) Inventor: Yasushi Tamura, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 322 days.

(21) Appl. No.: 17/381,720

(22) Filed: Jul. 21, 2021

(65) Prior Publication Data

US 2021/0351056 A1 Nov. 11, 2021

Related U.S. Application Data

(63) Continuation of application No. PCT/JP2020/001160, filed on Jan. 16, 2020.

(30) Foreign Application Priority Data

Jan. 23, 2019 (JP) ................................. 2019-009174

(51) Int. Cl.
*H01L 21/68* (2006.01)
*H01L 21/67* (2006.01)
(Continued)

(52) U.S. Cl.
CPC ...... *H01L 21/681* (2013.01); *H01L 21/67144* (2013.01); *H01L 24/75* (2013.01);
(Continued)

(58) Field of Classification Search
CPC ..... H01L 21/681; H01L 23/544; H01L 24/75; H01L 2223/54426; H01L 2324/75252;
(Continued)

(56) References Cited

U.S. PATENT DOCUMENTS

| 6,961,994 B2 * | 11/2005 | Terada | H05K 13/089 |
| | | | 29/832 |
| 2008/0127486 A1 * | 6/2008 | Hirata | H01L 24/81 |
| | | | 257/E21.705 |
| 2020/0006099 A1 * | 1/2020 | Yamauchi | H01L 22/12 |

FOREIGN PATENT DOCUMENTS

| JP | 2014-45011 A | 3/2014 |
| JP | 2017-208522 A | 11/2017 |

(Continued)

OTHER PUBLICATIONS

International Search Report of the corresponding International Application No. PCT/JP2020/001160, dated Feb. 7, 2020.

*Primary Examiner* — Igwe U Anya
(74) *Attorney, Agent, or Firm* — Global IP Counselors, LLP

(57) ABSTRACT

A mounting device comprises a recognition mechanism and a control unit. The recognition mechanism recognizes a chip recognition mark and a substrate recognition mark through a mounting head and from above the mounting head and is movable in an in-plane direction of a substrate surface of a substrate. The control unit is connected to the recognition mechanism, calculates an amount of misalignment between a chip component and the substrate from position information about the chip recognition mark and the substrate recognition mark obtained from the recognition mechanism, and performs positioning by driving the mounting head and/or the substrate stage according to the amount of misalignment. The recognition mechanism has a chip recognition sensor for recognizing the chip recognition mark and a substrate recognition sensor for recognizing the substrate recognition mark provided independently so that focal positions thereof are different via a common optical axis path.

8 Claims, 10 Drawing Sheets

(51) Int. Cl.
*H01L 23/00* (2006.01)
*H01L 23/544* (2006.01)

(52) U.S. Cl.
CPC .. *H01L 23/544* (2013.01); *H01L 2223/54426* (2013.01); *H01L 2223/54486* (2013.01); *H01L 2224/75252* (2013.01); *H01L 2224/75702* (2013.01); *H01L 2224/75745* (2013.01); *H01L 2224/75753* (2013.01); *H01L 2224/75901* (2013.01)

(58) Field of Classification Search
CPC ..... H01L 21/67144; H01L 2223/54486; H01L 2324/75702; H01L 2324/75745; H01L 2324/75753; H01L 2324/75901
USPC .......................................................... 438/7
See application file for complete search history.

(56) References Cited

FOREIGN PATENT DOCUMENTS

| | | |
|---|---|---|
| JP | 2018-56481 A | 4/2018 |
| WO | 03/041478 A1 | 5/2003 |

* cited by examiner

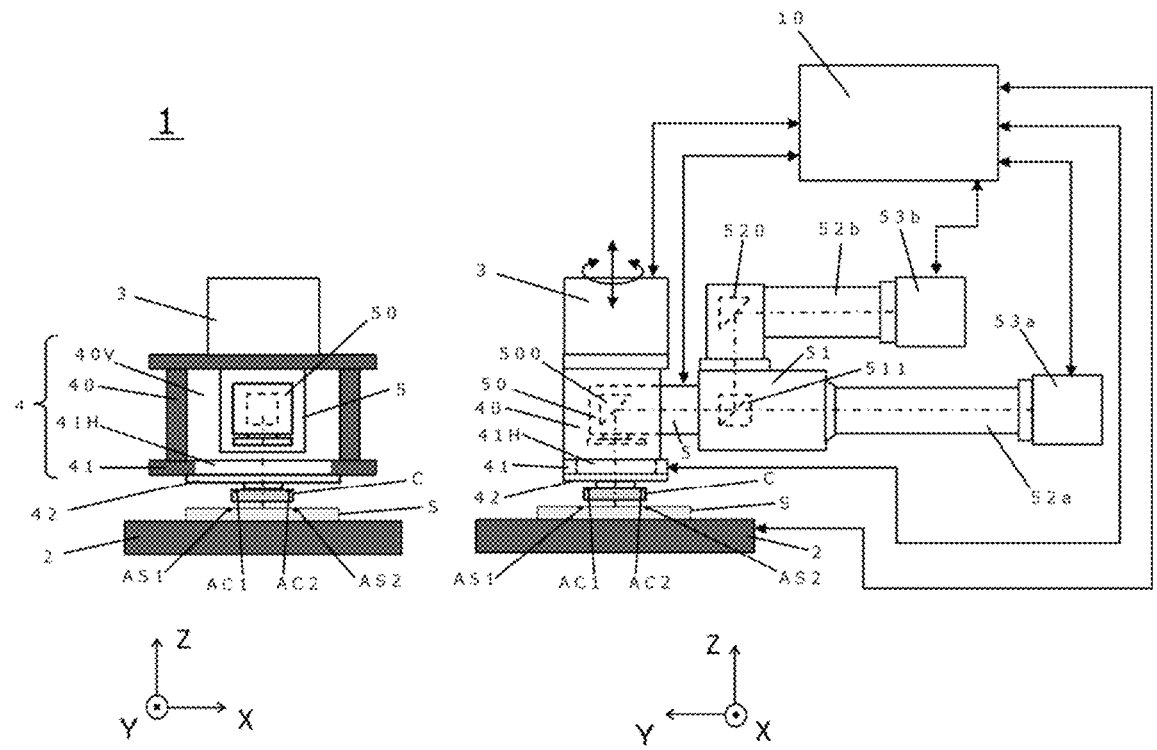
FIG. 1A
FIG. 1B
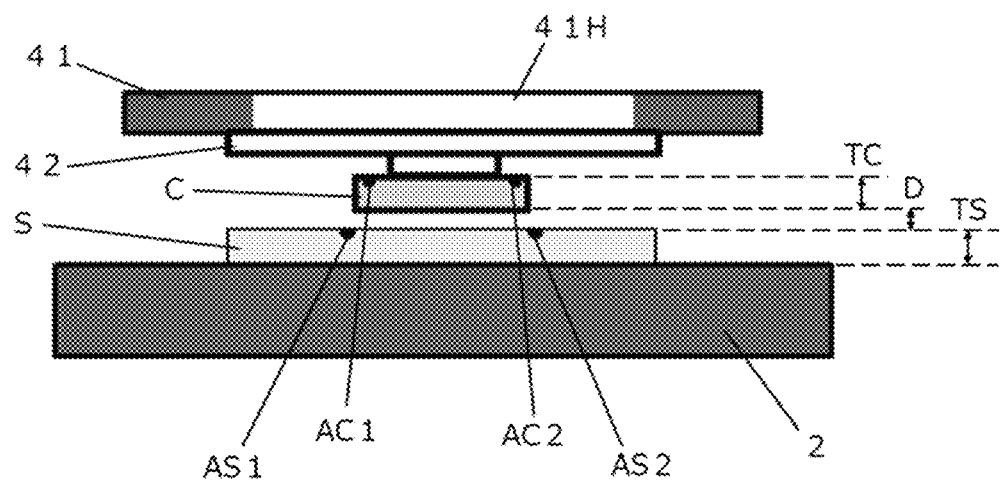
FIG. 2

MOUNTING DEVICE AND MOUNTING METHOD

CROSS-REFERENCE TO RELATED APPLICATIONS

This application is a continuation application of PCT International Application No. PCT/JP2020/001160 filed on Jan. 16, 2020, which claims priority to Japanese Patent Application No. 2019-009174 filed on Jan. 23, 2019. The entire disclosures of PCT International Application No. PCT/JP2020/001160 and Japanese Patent Application No. 2019-009174 are hereby incorporated herein by reference.

BACKGROUND

Field of the Invention

The present invention relates to a mounting device and a mounting method for mounting a chip component on a substrate. In particular, the present invention relates to a mounting device and a mounting method for performing face-up mounting in which the electrode surface of the substrate and the electrode surface of the chip component face in the same direction.

Background Information

Two well-known mounting forms for mounting a semiconductor chip or other such chip component on a wiring substrate or other such substrate include face-down mounting, in which the electrode surface of the chip component is mounted facing the electrode surface of the substrate, and face-up mounting, in which the electrode surface of the substrate and the electrode surface of the chip component are mounted facing in the same direction.

In both of these mounting forms, highly accurate positioning is required for mounting the chip component at the specified position on the substrate, and recognition marks for positioning are made on the chip component and the substrate. Here, the reason for positioning the chip component at a specific position on the substrate is so that there will be a specific level of accuracy in the positional relationship between the electrodes of the substrate and the electrodes of the chip component, and with both face-down mounting and face-up mounting, the recognition mark position is generally disposed on the substrate and the chip component by using the electrode position as a reference, and the marks are made on the electrode surface side where the relative position is clear.

FIGS. 13A and B show a comparative example of face-up mounting. As shown in FIG. 13A, a chip component C is generally given two chip component recognition marks (hereinafter referred to as a chip recognition mark), namely, a chip recognition first mark AC1 and a chip recognition second mark AC2 (These are disposed diagonally opposite each other in the example of FIG. 13A). Meanwhile, a substrate S is generally given two substrate recognition marks, namely, a substrate recognition first mark AS1 and a substrate recognition second mark AS2 (These are disposed diagonally opposite each other in the example of FIG. 13A). In view of this, in positioning, the misalignment (the position and angle in the in-plane direction of the substrate) with respect to the specified mounting position is found from the positional relationships between the chip recognition first mark AC1 and the substrate recognition first mark AS1, and between the chip recognition first mark AC2 and the substrate recognition second mark AS2, and the relative position is corrected before mounting (FIG. 13B).

In both face-down mounting and face-up mounting, a chip component held by the mounting head and from above is mounted by being press-fitted onto a substrate. Accordingly, in face-down mounting in which the electrodes of the substrate and the chip component are opposite each other, there is a known a method in which the substrate recognition mark and the chip recognition mark are directly observed at the same time by using an upper and lower two-field camera. On the other hand, in face-up mounting in which the electrodes of the substrate and the chip component are mounted facing in the same direction, the electrode surface of the chip component is in close contact with the mounting head, so there is a problem of how to accurately ascertain the position of the chip recognition mark.

To solve this problem, a method of using an upper and lower two-field camera as shown in FIG. 14A can be conceived, for example. With this method, as shown in FIG. 14B, the positional relationship between the position of the chip recognition first mark AC1 of the chip component C and the corner CC1 of the chip component C closest to the chip recognition first mark AC1 (i.e., $\Delta X1$ and $\Delta Y1$, where $\Delta X1$ represents the distance between the chip recognition first mark AC1 and the corner CC1 in X direction and $\Delta Y1$ represents the distance between the chip recognition first mark AC1 and the corner CC1 in Y direction) is found in advance in a separate step (the same applies to the positional relationship between the chip recognition second mark AC2 and the corner CC2 of the chip component C closest to AC2 (i.e., $\Delta X2$ and $\Delta Y2$, where $\Delta X2$ represents the distance between the chip recognition second mark AC2 and the corner CC2 in X direction and $\Delta Y2$ represents the distance between the chip recognition second mark AC2 and the corner CC2 in Y direction), and the substrate recognition first mark AS1 of the substrate S, the corner CC1 of the chip component C, the substrate recognition second mark, and the corner CC2 of the chip component C are observed with the upper and lower two-field camera, after which the positional relationship between the chip recognition marks and the corners of the chip component found in advance is used in calculation to position the substrate S and the chip component C. This method does allow the use of an upper and lower two-field camera as in face-down mounting, but also entails the following problems. (1) A separate device or step is required for ascertaining the positional relationship between the chip recognition marks and the corner portions of the chip component C, resulting in higher cost or a decrease in productivity. (2) Since the corners and ends of the chip component C are susceptible to chipping and the recognition accuracy of the corners is generally inferior to that of a recognition mark, the alignment accuracy is diminished.

Because of this, methods have been proposed in which a transparent member is used for the part of the mounting head that holds the chip component, or some other such contrivance, allowing the recognition marks to be observed through the mounting head, so that the recognition marks of a chip component can be directly observed and positioned even in face-up mounting (see International Publication No. 2003/041478 (Patent Literature 1) and Japanese Patent Application Publication 2017-208522 (Patent Literature 2), for example).

SUMMARY

Semiconductor components have made tremendous strides in terms of increasing their density, adding more electrodes, and narrowing their pitch, and there is a need for mounting that allows accurate positioning to be performed rapidly, and without a significant cost increase. In the device described in Patent Literature 2, since there is a difference in height between the chip recognition mark and the substrate recognition mark at the positioning stage, the optical path lengths of the chip recognition first mark AC1 and the substrate recognition first mark AS1 (as well as the chip recognition second mark AC2 and the substrate recognition second mark AS2) are different, and the relation to focal depth can make it difficult to acquire images of the chip recognition mark and the substrate recognition mark at the same time in high resolution, making it necessary to drive the imaging unit to focus on the image of each recognition mark, which causes problems in that mounting accuracy decreases and productivity declines. Furthermore, the structure of the reflecting optical system is very complicated, which is a problem in that the cost is higher.

In view of this, as shown in FIGS. 15A, 15B, 16A, 16B, 17A, 17B, 18A and 18B, the same inventor as that of the present application has also come up with an invention for individually focusing on the substrate recognition first mark AS1, the chip recognition first mark AC1, the chip recognition second mark AC2, and the substrate recognition second mark AS2, and obtaining highly accurate position information.

The operation as shown in FIGS. 15A, 15B, 16A, 16B, 17A, 17B, 18A and 18B makes it possible to provide high accuracy and cost reduction in the positioning of the chip component C with respect to the substrate S, but the recognition mechanism has to be moved to each recognition mark position in order to recognize the recognition marks individually, which increases the operating time and may affect productivity.

The present invention was conceived of in view of the above problems, and provides a mounting device and a mounting method with which rapid and accurate positioning can be achieved, without a significant cost increase, in face-up mounting in which the electrode surface of the substrate and the electrode surface of the chip component face in the same direction.

In view of the state of the known technology and in accordance with a first aspect of the present disclosure,
a mounting device is provided for face-up mounting of a chip component having a positioning-use chip recognition mark and a substrate having a positioning-use substrate recognition mark, in an orientation in which the chip recognition mark and the substrate recognition mark are facing up, the mounting device comprising:
a substrate stage configured to hold the substrate;
a mounting head configured to hold the chip component;
an elevator configured to raise and lower the mounting head in a direction perpendicular to the substrate;
a recognition mechanism configured to recognize the chip recognition mark and the substrate recognition mark through the mounting head and from above the mounting head, the recognition mechanism being movable in an in-plane direction of a substrate surface of the substrate; and
a control unit connected to the recognition mechanism, the control unit being configured to calculate an amount of misalignment between the chip component and the substrate from position information about the chip recognition mark and the substrate recognition mark obtained from the recognition mechanism, and configured to perform positioning by driving the mounting head and/or the substrate stage according to the amount of misalignment,
the recognition mechanism having a chip recognition sensor configured to recognize the chip recognition mark and a substrate recognition sensor configured to recognize the substrate recognition mark, the chip recognition sensor and the substrate recognition sensor being independently provided so that focal positions thereof are different via a common optical axis path.

In accordance with a second aspect of the present disclosure, with the mounting device according to the first aspect,
the recognition mechanism is configured to simultaneously recognize the chip recognition mark and the substrate recognition mark while a center of an optical axis of the recognition mechanism is disposed at a position near a midpoint between the chip recognition mark and the substrate recognition mark.

In accordance with a third aspect of the present disclosure, with the mounting device according to the second aspect,
after lowering the mounting head holding the chip component in the direction perpendicular to the substrate to bring the chip component into close contact with the substrate subsequent to performing the positioning,
the control unit is configured to cause the recognition mechanism to start a parallel recognition operation of the chip recognition mark and the substrate recognition mark and recognize the chip recognition mark and the substrate recognition mark through the mounting head in a mounted state in which the chip component is in close contact with the substrate, and configured to calculate mounting position accuracy of the chip component and the substrate.

In accordance with a fourth aspect of the present disclosure, with the mounting device according to the third aspect,
during the parallel recognition operation of the chip recognition mark and the substrate recognition mark for calculating the mounting position accuracy that has been started after the chip component is brought into close contact with the substrate,
the recognition mechanism is configured to use either the chip recognition sensor or the substrate recognition sensor to simultaneously recognize the chip recognition mark and the substrate recognition mark while the center of the optical axis of the recognition mechanism is disposed at the position near the midpoint between the chip recognition mark and the substrate recognition mark.

In accordance with a fifth aspect of the present disclosure, with the mounting device according to the fourth aspect,
the control unit is configured to feed back a calculation result of the mounting position accuracy to a mounting position to automatically calibrate and adjust the mounting position.

In view of the state of the known technology and in accordance with a sixth aspect of the present disclosure, a mounting method is provided in which a chip component having a positioning-use chip recognition mark is mounted on a substrate having a positioning-use substrate recognition mark, the method comprising:
positioning relative positional relation between the chip component and the substrate by recognizing, in a state where the chip component is disposed with a gap between itself and the substrate, the chip recognition mark and the substrate recognition mark simultaneously from a same direction through a mounting head by a recognition mechanism in which a chip recognition sensor for recognizing a chip recognition mark and a substrate recognition sensor for recognizing a substrate recognition mark are independently provided so that focal positions thereof are different, via a common optical axis path;

mounting by bringing the chip component into close contact with the substrate and pressing; and measuring and inspecting mounting position accuracy by recognizing, in a mounted state in which the chip component is in close contact with the substrate, the chip recognition mark and the substrate recognition mark from the same direction through the mounting head, and by calculating the relative positional relation between the chip component and the substrate, after the chip component is in close contact with the substrate, the mounting and the measuring and inspecting of the mounting position accuracy being performed in parallel.

In accordance with a seventh aspect of the present disclosure, with the mounting method according to the sixth aspect, during the measuring and inspecting of the mounting position accuracy, the recognition mechanism uses either the chip recognition sensor or the substrate recognition sensor to simultaneously recognize the chip recognition mark and the substrate recognition mark while a center of an optical axis of the recognition mechanism is disposed at a position near a midpoint between the chip recognition mark and the substrate recognition mark.

In accordance with an eighth aspect of the present disclosure, the mounting method according to the seventh aspect further comprises feeding back a calculation result of the mounting position accuracy calculated during the measuring and inspecting of the mounting position accuracy to a mounting position to automatically calibrate and adjust the mounting position.

The present invention makes it possible to realize a mounting device and a mounting method with which rapid and accurate positioning can be achieved, without a significant cost increase, in face-up mounting in which the electrode surface of the substrate and the electrode surface of the chip component face in the same direction. In other words, the present invention makes it possible to provide a mounting device and a mounting method with which, in face-up mounting in which the electrode surface of a substrate and the electrode surface of a chip component both face in the same direction, stable, high-speed, and highly accurate positioning can be performed with a minimum of cost increase.

BRIEF DESCRIPTION OF THE DRAWINGS

FIG. 1A is a diagram of the appearance of the mounting device according to an embodiment of the present disclosure, and FIG. 1B is a diagram showing the appearance and the constituent elements of this mounting device as viewed from another angle;

FIG. 2 is a diagram illustrating the positional relationship when positioning a chip component and a substrate with the mounting device according to an embodiment of the present disclosure;

DETAILED DESCRIPTION OF EMBODIMENTS

Figure 3:
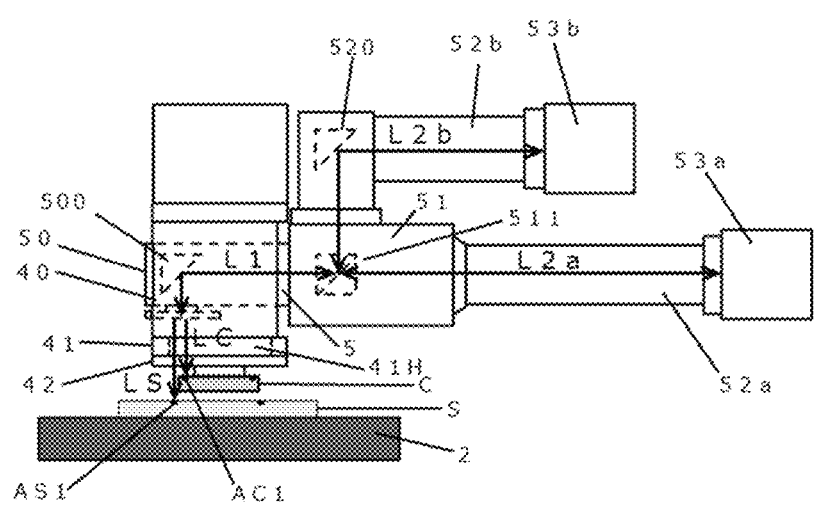
FIG. 3 is a diagram illustrating a state in which the mounting device according to an embodiment of the present disclosure simultaneously acquires the position information about a substrate first recognition mark and position information about a chip component first recognition mark during the positioning of a chip component and a substrate.

An embodiment of the present disclosure will be described with reference to the drawings. FIG. 1A shows the appearance of a mounting device 1 according to an embodiment of the present disclosure, and FIG. 1B is an external view as seen from a different angle from that in FIG. 1A, and also shows the constituent elements including a control system.

The mounting device 1 is a device for face-up mounting by positioning a chip component C (e.g., an electronic circuit or integrated circuit) on a substrate S, in which a chip recognition first mark AC1 and a chip recognition second mark AC2 made on the chip component C, and a substrate recognition first mark AS1 and a substrate recognition second mark AS2 made on the substrate are used for positioning. More specifically, the chip component C is mounted on the substrate S after the positional relationship between the chip recognition first mark AC1 and the substrate recognition first mark AS1, and the positional relationship between the chip recognition second mark AC2 and the substrate recognition second mark AS2 have been corrected to within an allowable range.

The chip component C is generally mounted on the substrate S via a thermosetting adhesive. The thermosetting adhesive is usually provided on the opposite side from the electrode surface of the chip component C (the surface with the chip recognition marks), but may instead be provided on the substrate S side.

The mounting device 1 includes as constituent elements a substrate stage 2, an elevating and pressing unit 3 (e.g., an elevator), a mounting head 4, a recognition mechanism 5, and a control unit 10.

The substrate stage 2 has a function of holding the substrate S and moving the substrate S in the in-plane direction (within the XY plane). Here, vacuum chucking is suitable for holding the substrate S, but the present disclosure is not limited to this, and an electrostatic chucking method may be employed instead.

The elevating and pressing unit 3 (e.g., the elevator) has a function of moving the mounting head 4 in the direction perpendicular to the substrate S (Z direction), and a function of adjusting the pressing force on the chip component C via the mounting head 4, and preferably has a function of adjusting the angle by which the mounting head 4 rotates around the axis in the Z direction. In the illustrated embodiment, the elevating and pressing unit 3 includes an electronic actuator or an electronic motor, for example.

The mounting head 4 holds the chip component C and press fits it to the substrate S. The mounting head 4 includes as constituent elements a head body 40, a heater unit 41 (e.g., a heater), and an attachment tool 42. The head main body 40 is linked to the elevating and pressing unit 3, and the heater portion 41 is held and disposed on the lower side. The heater unit 41 has a heat generating function, and is used to heat the chip component C via the attachment tool 42. The heater unit 41 also has a function of using a decompression flow path (not shown) to hold the attachment tool 42 by suction. The attachment tool 42 holds the chip component C by suction, is selected to match the shape of the chip component C, and is held to the heater unit 41 by suction.

In the present disclosure, the substrate recognition marks and the chip recognition marks are observed through the mounting head 4. Therefore, in this embodiment, the attachment tool 42 is made of a transparent member, but through-holes may instead be provided at positions matching those of the substrate recognition marks and the chip recognition marks. The heater portion 41 needs either to be formed of a transparent member or provided with an opening so that the substrate recognition marks and the chip recognition marks can be observed, and in this embodiment, a through-hole 41H is provided. Here, through-holes 41H may be provided to match the positions of the individual substrate recognition marks and chip recognition marks, but it is preferable to use a hole shape that can accommodate the entire dimensional specification range since the part will not have to be replaced depending on the shape of the chip component. Also, the mounting head 4 needs a space into which an image capture unit 50 for observing the substrate recognition marks and the chip recognition marks can enter, and in this embodiment, a head space 40V is provided as shown in FIGS. 1A and 1B. That is, in the mounting device 1 in FIGS. 1A and 1B, the head main body 40 has a structure made up of side plates and a top plate, provided on the heater portion 41.

The recognition mechanism 5 is used to acquire position information by recognizing the positions of the substrate recognition marks and the chip recognition marks through the mounting head 4, via the attachment tool 42 and the heater unit 41. In this embodiment, the recognition mechanism 5 includes as constituent elements the image capture unit 50, an optical system (shared) 51, an optical system 52a and an optical system 52b that branch in two from the optical system 51 with a shared optical axis, an imaging means 53a linked to the optical system 52a, and an imaging means 53b linked to the optical system 52b. Also, by providing the "path from the image capture unit 50 to the optical system 51 and the optical system 52a" and the "path from the image capture unit 50 to the optical system 51 and the optical system 52b" so as to have different optical path lengths results in a configuration in which the focal position of the imaging means 53a and the focal position of the imaging means 53b are different. In the illustrated embodiment, the imaging means 53a and the imaging means 53b each include an image sensor, such as a solid state image sensor (e.g., a CCD image sensor, a CMOS image sensor, and the like).

The image capture unit 50 is disposed at the upper part of the recognition target acquired by the imaging means 53a and the imaging means 53b, and accommodates the recognition target within the field of view. The optical system (shared) 51 has a function of changing the direction of the optical path by a reflecting means 500 and a reflecting means 520, and the optical path is branched by a half mirror 511. The optical system 52a and the optical system 52b have an optical lens and have a function of enlarging an image in order to obtain higher resolution. In the illustrated embodiment, the reflecting means 500 and the reflecting means 520 each include a mirror or reflector.

Also, the recognition mechanism 5 has a configuration capable of moving in the in-plane direction of the substrate S (and the chip component C) within the head space 40V by a drive mechanism (not shown). Furthermore, the recognition mechanism 5 can preferably also move in the direction perpendicular to the substrate S (Z direction) so that the focal position can be adjusted when the thickness of the substrate S is changed.

The mounting head 4 has a configuration that allows independent movement in the direction perpendicular to the substrate S (Z direction), and the head space 40V is designed to be small enough not to interfere with the recognition mechanism 5 that has entered the head space 40V even if the mounting head 4 moves in the vertical direction.

The control unit 10 controls the operation of the mounting device 1, and is connected to the substrate stage 2, the elevating and pressing unit 3, the mounting head 4, and the recognition mechanism 5.

The main constituent elements of the control unit 10 are essentially a CPU (Central Processing Unit) (e.g., an electronic controller or processor) and a memory device (e.g., a computer memory). The control unit 10 is connected to each device via an interface as needed, and if a program is installed, operations can be performed using acquired data, and it is also possible to perform output according to the operational results.

The control unit 10 is connected to the substrate stage 2 and has a function of controlling the holding and release of the substrate S by the substrate stage 2, and of controlling movement in the in-plane direction of the substrate S.

The control unit 10 is connected to the elevating and pressing unit 3 and has a function of controlling the drive of the mounting head 4 in the direction perpendicular to the substrate S (Z direction), rotational drive in the around the Z direction, and the pressing force.

The control unit 10 is connected to the mounting head 4 and has a function of holding and releasing the chip component C by suction of the attachment tool 42, and controlling the heating temperature of the heater unit 41.

The control unit 10 is connected to the recognition mechanism 5 and has a function of controlling drive in the in-plane direction of the substrate S (and the chip component C) and drive in the direction perpendicular to the substrate S (Z direction), as well as acquiring image data by controlling the imaging means 53a and the imaging means 53b. Furthermore, the control unit 10 has an image processing function, and has a function of finding the positions of recognition marks in an image acquired by the imaging means 53a and the imaging means 53b.

The step of positioning the substrate S and the chip component C with the mounting device 1 shown in FIGS. 1A and 1B will now be described.

First, in the pre-positioning process, the control unit 10 holds the substrate S on the substrate stage 2 and holds the chip component C on the mounting head 4. The substrate S here is disposed within a specific range of the substrate stage 2, and the chip component C is held within a specific range of the attachment tool 42. That is, the chip component C and the substrate S are roughly positioned. Accordingly, the substrate recognition first mark AS1, the substrate recognition second mark AS2, the chip recognition first mark AC1, and the chip recognition second mark AC2 can all be observed through the mounting head 4 by looking through the through-hole 41H of the heater 41 and the attachment tool 42.

The positioning step using the mounting device 1 can be performed with the chip component C close to the substrate S, since the substrate recognition marks and the chip recognition marks are observed from the same direction. However, the substrate S and the chip component C need to be far enough apart relative in the in-plane direction of the substrate S will be possible without interference.

FIG. 2 shows this state, in which a gap D is provided between the substrate S and the chip component C during positioning. That is, the substrate recognition marks and the chip recognition marks have a height difference of "thickness TC of chip component C+gap D" in the direction perpendicular to the substrate S.

With the mounting device 1 in this embodiment, accurate positioning can be performed in a short time by simultaneously acquiring images focused on the substrate recognition marks and the chip recognition marks having a height difference, on a shared optical axis path.

Figure 4A:
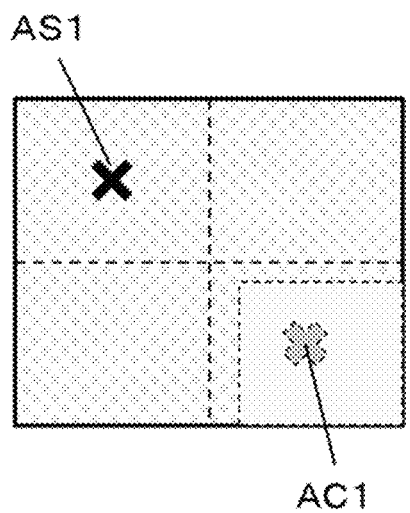
FIG. 4A is a diagram showing an image example of a substrate recognition imaging means focusing on a substrate first recognition mark.
Figure 4B:
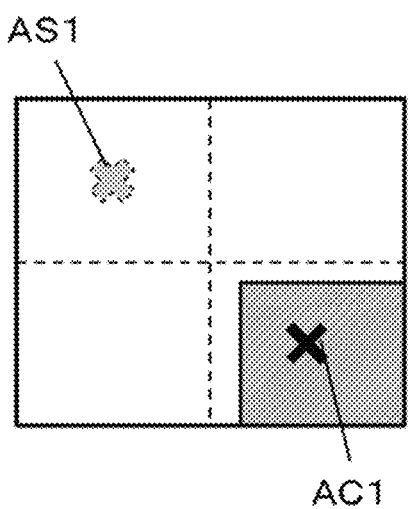
FIG. 4B is a diagram showing an image example of a chip recognition imaging means focusing on a chip component first recognition mark, in a state in which the mounting apparatus according to an embodiment of the present disclosure simultaneously acquires position information about the substrate first recognition mark and position information about the chip first recognition mark during the positioning of the chip component and the substrate.
Figure 5:
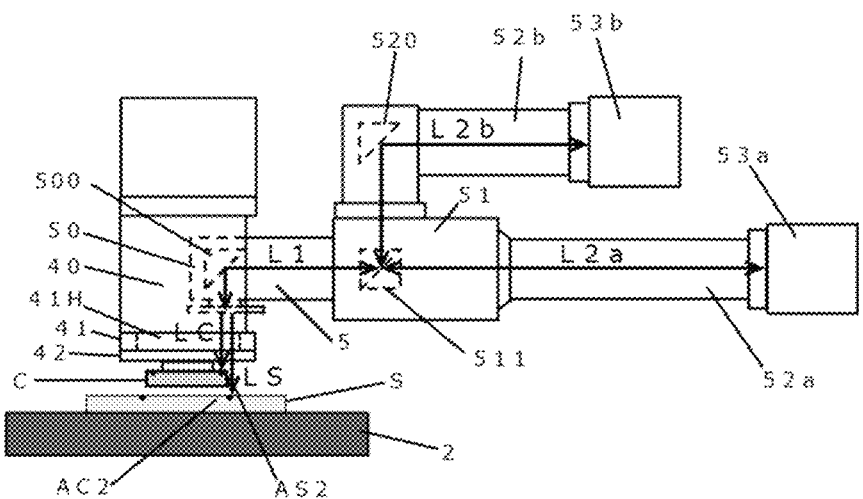
FIG. 5 illustrates a state in which the mounting device according to an embodiment of the present disclosure simultaneously acquires position information about the substrate second recognition mark and position information about the chip component second recognition mark during the positioning of the chip component and the substrate.

FIGS. 3 to 5 illustrate the specific operation, and FIG. 3 shows a state in which the substrate recognition first mark AS1 and the chip recognition first mark AC1 are simultaneously recognized to obtain position information.

In the state in FIG. 3, either the imaging means 53a or the imaging means 53b serves as the substrate recognition imaging means or sensor to capture an image focused on the substrate recognition first mark AS1, and the other one serves as the chip recognition imaging means or sensor to capture an image focused on the chip recognition first mark AC1. In the following description, an example will be described in which the imaging means 53a captures an image of the substrate recognition first mark AS1, and the imaging means 53b captures an image of the chip recognition first mark AC1, that is, an example in which the imaging means 53a functions as the substrate recognition imaging means or sensor and the imaging means 53b functions as the chip recognition imaging means or sensor. Also, it is preferable for the imaging means 53a, the imaging means 53b, the optical system 52a, and the optical system 52b all to have the same specifications, such as the number of image sensors and the optical lens magnification, and the configuration is such that the optical path length from the substrate recognition first mark AS1 to the imaging means 53a is equal to the optical path length from the chip recognition first mark AC1 to the imaging means 53b.

If we let LS be the vertical distance from the substrate recognition first mark AS1 to the image capture unit 50, LC be the vertical distance from the chip recognition first mark AC1 to the image capture unit 50, L1 be the optical path length within the optical system 51 (from the image capture unit 50 to the half mirror 511) (i.e., the distance from the reflecting means 500 to the half mirror 511), L2a be the optical path length of the optical system 52a (from the half mirror 511 to the image sensor surface of the imaging means 53a), and L2b be the optical path length of the optical system 52b (from the half mirror 511 to the image sensor surface of the imaging means 53b), the recognition mechanism 5 is configured to satisfy the following equation (1), in which the optical path length from the substrate recognition first mark AS1 to the image sensor surface of the imaging means 53a is equal to the optical path length from the chip recognition first mark AC1 to the image sensor surface of the imaging means 53b.

$$LS+L1+L2a=LC+L1+L2b \quad (1)$$

Also, in order to focus on the substrate recognition marks and the chip recognition marks, which have a height difference, during positioning, the positional relationship is set to satisfy the equation (2). That is, setting the difference between the focal position of the imaging means 53a and the focal position of the imaging means 53b to be "thickness TC of chip component C+gap D" allows the substrate recognition marks and the chip recognition marks having a height difference to be in focus at the same time.

$$LS-LC=\text{thickness } TC \text{ of chip component } C+gap\ D \quad (2)$$

Here, since the thickness TC of the chip component C fluctuates within the specification range defined for the mounting device 1, a design that will satisfy the following equation (3) makes it possible to ensure the minimum gap away from the substrate S, even with a chip component having the maximum thickness.

$$LS-LC=\text{maximum thickness of chip component } C(\max TC)+\text{minimum } gap\ (\min D) \quad (3)$$

Also, since the thickness TS of the substrate S also fluctuates within the specification range defined for the mounting device 1, positional control of the recognition mechanism 5 in the vertical direction so as to focus on the substrate recognition marks according to the thickness TS of the substrate S, and positional control so that the position of the mounting head 4 in the vertical direction (Z direction) satisfies the above equation (2) allows for positioning over the entire thickness specification range of the substrate S.

Consequently, the imaging means 53a obtains an image focused on the substrate recognition first mark AS1 as shown in FIG. 4A, and the imaging means 53b obtains an image focused on the chip recognition first mark AC1 as shown in FIG. 4B. Moreover, images focused on the substrate recognition first mark AS1 and the chip recognition first mark AC1 can be simultaneously obtained via a shared optical axis path. Here, if the coordinate positional relationship of the images obtained by the two imaging means is made clear, then relative position information about the substrate recognition first mark AS1 and the chip recognition first mark AC1 can be obtained.

Since the imaging means 53a and the imaging means 53b both produce images obtained by branching from the same optical path, the image capture unit 50 must be disposed at a position where the substrate recognition first mark AS1 and the chip recognition first mark AC1 are in the same field of view. That is, in acquiring position information about the substrate recognition first mark AS1 and the chip recognition first mark AC1, the control unit 10 controls the drive means (i.e., the electronic actuator or motor) of the recognition mechanism 5 so that the image capture unit 50 is disposed at a position where the substrate recognition first mark AS1 and the chip recognition first mark AC1 are both in the field of view. Here, it is most preferable for the image capture unit 50 to be disposed so that the center of the optical axis of the image capture unit 50 is located near the midpoint of the substrate recognition first mark AS1 and the chip recognition first mark AC1.

After the substrate recognition first mark AS1 and the chip recognition first mark AC1 have been recognized in the state of FIG. 3 to obtain position information, the control unit 10 controls the drive means (i.e., the electronic actuator or motor) of the recognition mechanism 5 so that the image capture unit 50 will be disposed at a position where the substrate recognition second mark AS2 and the chip recognition second mark AC2 are both in the same field of view, as shown in FIG. 5. At this point, if movement is in the in-plane direction of the substrate, the equations (1) and (2) will continue to hold, so a state in which each of the substrate recognition mark and the chip recognition mark is in focus will be maintained even if the recognition mechanism 5 does move in the vertical direction (Z direction) of the substrate S.

In the state in FIG. 5, an image focused on the substrate recognition second mark AS2 by the imaging means 53a and an image focused on the chip recognition second mark AC2 by the imaging means 53b are simultaneously acquired via a shared optical axis path, and relative position information about the substrate recognition second mark AS2 and the chip recognition second mark AC2 is obtained.

Next, positioning of the substrate S and the chip component C is performed using relative position information about the substrate recognition first mark AS1 and the chip recognition first mark AC1 obtained in the state in FIG. 3, and relative position information about the substrate recognition second mark AS2 and the chip recognition second mark AC2 obtained in the state in FIG. 5. Specifically, first, the control unit 10 calculates the amount of misalignment between the substrate S and the chip component C from the relative position information about the substrate recognition first mark AS1 and the chip recognition first mark AC1, and the relative position information about the substrate recognition second mark AS2 and the chip recognition second mark AC2. After this, the correction movement amount of the substrate S and the chip component C in the substrate plane for correcting this misalignment is calculated, and the substrate stage 2 and/or the mounting head 4 is driven in the substrate in-plane direction to perform positioning such that the amount of misalignment between the substrate S and the chip component C falls within the permissible range.

With the mounting device 1 configured as above, when positioning the chip component C and the substrate S, images can be simultaneously captured in a state in which the chip recognition marks and the substrate recognition marks are both in focus via a shared optical axis path, so only half as many images need to be captured, which makes positioning faster, and a clear image of each mark, in focus, can be captured. Also, and the coordinate error of the image capture unit 50 can be reduced only half as many imaging positions are needed, so good accuracy can be achieved without a significant increase in cost.

After the positioning of the substrate S and the chip component C is complete, the mounting step is begun. In the mounting step, the control unit 10 lowers the mounting head 4, brings the chip component C into close contact with the substrate S, and mounts the chip component C at a specific pressing force. During this, the chip component C is affixed to the substrate S by heating a thermosetting adhesive between the substrate S and the chip component C with the heater portion 41 of the mounting head 4. After pressing and heating for a predetermined time, the mounting head 4 releases the suction holding the chip component C and rises, thus completing the mounting step.

Incidentally, from the standpoint of quality control, has become necessary to perform mounting position accuracy measurement and inspection for all marks after the completion of the mounting step. However, performing mounting position accuracy measurement with another device after the mounting step is completed drives up the cost. Also, if a problem with mounting position accuracy should occur, it will take time to notice this, which delays corrective measures. In view of this, a function is added of using the recognition mechanism 5 of the mounting device 1 to obtain position information about the substrate recognition first mark AS1 and the chip recognition first mark AC1 and position information about the substrate recognition second mark AS2 and the chip recognition second mark AC2 just as in the positioning after the mounting step is complete, and thereby find the mounting position accuracy in a state in which the chip component C is mounted on the substrate S. However, using the recognition mechanism 5 of the mounting device 1 to measure the mounting position accuracy after the mounting step is complete increases the operation time of the mounting position accuracy measurement, so this results in a marked drop in productivity, particularly when mounting position accuracy measurement and inspection are performed for all marks.

In view of this, in the present disclosure, attention is turned to a configuration with which the chip recognition marks and the substrate recognition marks can be recognized through the mounting head 4, and to determining the positional relationship between the substrate S and the chip component C at the stage when the chip component C is in close contact with the substrate S, and the mounting position accuracy can also be measured by obtaining position information about the substrate recognition marks and the chip recognition marks at a stage during the mounting step. That is, the chip component C held by the mounting head 4 and pressed against the substrate S that is held by the substrate stage 2 is fixed at the stage of being in close contact with the substrate S, and only when this state is maintained by adhesive curing, the measurement of mounting position accuracy is begun at a stage during the mounting step, with both steps being performed in parallel, which allows mounting accuracy measurement and inspection to be performed for all the marks without increasing the cost or decreasing the productivity.

Figures 6A, 6B:
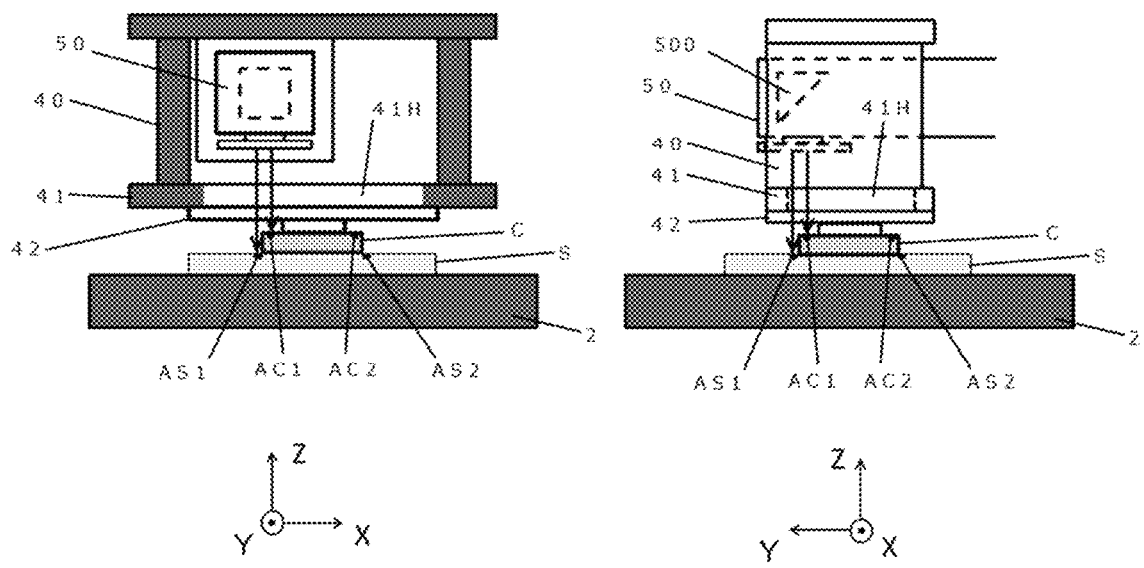
FIGS. 6A and 6B illustrate mounting position accuracy measurement by the mounting device according to an embodiment of the present disclosure, during the mounting step in which a chip component is mounted on a substrate, with FIG. 6A showing a state in which position information about the substrate first recognition mark and position information about the chip component first recognition mark are being acquired simultaneously, and FIG. 6B being a diagram of this same state when viewed from the side surface direction.

An embodiment will now be described in which the mounting position accuracy is measured in parallel with the mounting step using the mounting device 1. FIGS. 6A and 6B show a state in which the mounting device 1 has lowered the mounting head 4 in the mounting step to bring the chip component C into close contact with the substrate S. The mounting accuracy measurement and inspection step in this embodiment can be commenced immediately after the mounting head 4 is lowered and the chip component C is brought into close contact with the substrate S. Here, whether or not the chip component C is in close contact with the substrate S can be determined by a pressure sensor, a displacement sensor, or the like (not shown).

FIGS. 6A and 6B shows a process in which the mounting device 1 acquires position information about the substrate recognition first mark AS1 and the chip recognition first mark AC1 in the mounting step in which the chip component C is brought into close contact with the substrate S. The operation of the recognition mechanism 5 is the same as that in the positioning step shown in FIGS. 3 and 5. In FIGS. 6A and 6B, FIG. 6A is a diagram of the mounting device 1 as viewed from the Y direction, and FIG. 6B is a diagram of the mounting device 1 as viewed from the X direction (partially cut away). The relationship shown in FIGS. 6A and 6B is the same for FIGS. 8A and 8B (this also applies to FIGS. 10A, 10B, 11A, 11B, 12A and 12B).

In the state in FIGS. 6A and 6B, the vertical distance from the image capture unit 50 to the substrate S is the same as in the positioning step, but since the mounting head 4 is lowered, the vertical distance from the image capture unit 50 to the chip component C held by the mounting head 4 is different from that in the positioning process. Therefore, in order for the imaging means 53b to capture an image that is focused on the chip recognition first mark AC1, the recognition mechanism 5 needs to be moved in the vertical direction (Z direction).

Figure 7:
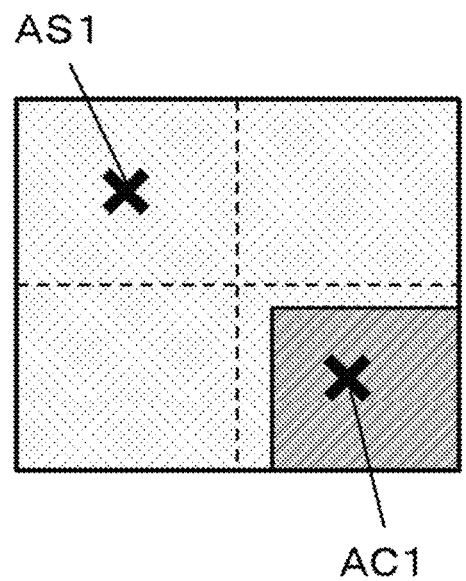
FIG. 7 illustrates mounting position accuracy measurement during the mounting step in which a chip component is mounted on a substrate in the mounting device according to an embodiment of the present disclosure, and is a diagram showing an image example of an imaging means that has acquired position information about the substrate first recognition mark and the chip component first recognition mark simultaneously and in the same visual field during mounting position accuracy measurement.

Incidentally, in a state in which the chip component C is in close contact with the substrate S, the gap D in FIG. 2 is at zero, and the height difference between the substrate recognition marks and the chip recognition marks in the up and down direction is the "thickness TC of the chip component C." That is, as the chip thickness TC decreases, the height difference between the substrate recognition marks and the chip recognition marks in the vertical direction also decreases. Here, if the height difference between the substrate recognition marks and the chip recognition marks in the vertical direction is within the depth of field of the imaging means 53a or the imaging means 53b, this means that the substrate recognition first mark AS1 and the chip recognition first mark AC1 can both be imaged clearly and simultaneously as shown in FIG. 7 by using one of these imaging means. Although the imaging means 53b may be used here, it is preferable to use the imaging means 53a with which the substrate recognition mark is in focus in the positioning step, because there will be no need to move the recognition mechanism 5 in the vertical direction (Z direction) in order to focus.

Figures 8A, 8B:
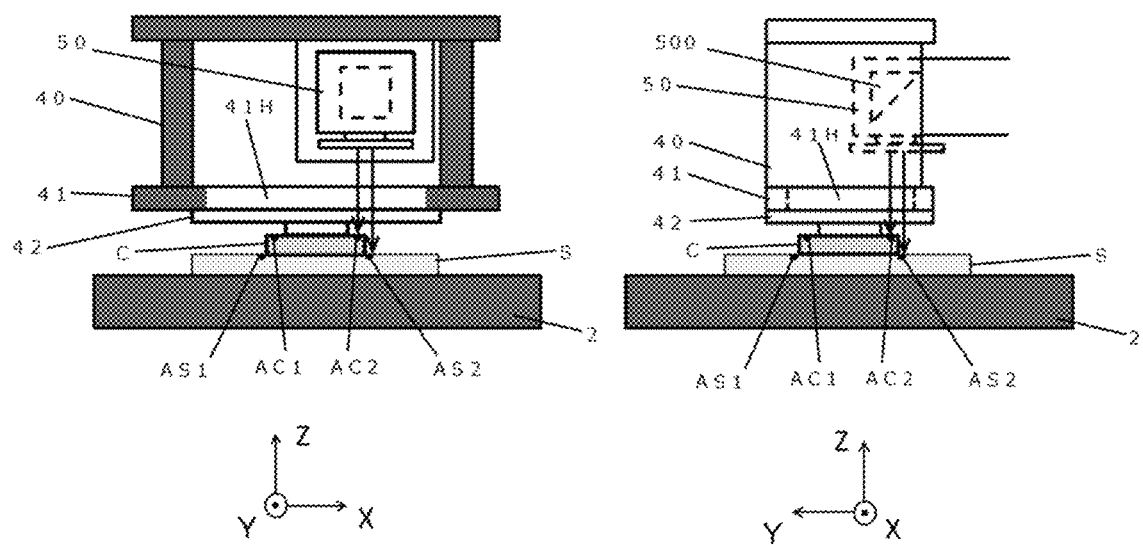
FIGS. 8A and 8B illustrate mounting position accuracy measurement during the mounting step in which a chip component is mounted on a substrate in the mounting device according to an embodiment of the present disclosure, with FIG. 8A showing a state in which position information about the substrate second recognition mark and position information about the chip component second recognition mark are acquired simultaneously, and FIG. 8B being a diagram of this same state when viewed from the side surface direction.

After that, the control unit 10 drives the recognition mechanism 5 to dispose the image capture unit 50 so that the substrate recognition second mark AS2 and the chip recognition second mark AC2 are in the same field of view in the state in FIGS. 8A and 8B, and to obtain relative position information about the recognition second mark AS2 and the chip recognition second mark AC2.

Next, the mounting position accuracy is obtained from the relative positional relationship between the substrate recognition first mark AS1 and the chip recognition first mark AC1 obtained in the state in FIGS. 6A and 6B, and the relative positional relationship between the substrate recognition second mark AS2 and the chip recognition second mark AC2 obtained in the state in FIGS. 8A and 8B. That is, for the relative positional relationship between the substrate recognition first mark AS1 and the chip recognition first mark AC1, and the relative positional relationship between the substrate recognition second mark AS2 and the chip recognition second mark AC2, the control unit 10 compares the position information actually obtained by recognition using the recognition mechanism 5 with that when the chip component C is accurately mounted at the specified position of the substrate S, and calculates the mounting position accuracy of the chip component C with respect to the substrate S.

A method with which either the imaging means 53a or the imaging means 53b can be used to image both the substrate recognition marks and the chip recognition marks clearly and simultaneously makes it possible to ascertain the relative positional relationship easily and accurately.

Incidentally, if it is possible to find the mounting position accuracy during the mounting step by using either the imaging means 53a or the imaging means 53b, then it is also possible to perform calibration calculation of the shift in the mounting position attributable to a change in the inclination of the optical axes or a change in the optical axis positions of the imaging means 53a and the imaging means 53b due to environmental changes, a change in the inclination of the elevating and pressing unit 3, or the like. That is, in the positioning step in which the imaging means 53a images the substrate recognition mark and the imaging means 53b images the chip recognition mark and positioning is performed, even if the amount of misalignment in the calculation result is within the allowable range, if there is misalignment in the mounting position accuracy measurement result in which either the imaging means 53a or the imaging means 53b is used to image the substrate recognition mark and the chip recognition mark, then it will be easy to determine that there has been a change in the optical axis positions or the optical axis inclination of the imaging means 53a and the imaging means 53b, or a change in the inclination of the elevating and pressing unit 3, and by automatically performing a constant calibration calculation, it always will be possible to mount stably, within the permissible range of the specified position, without shifting the mounting position of the chip component C with respect to the substrate S.

It is thus possible to perform extremely stable and highly accurate mounting, without an attendant rise in cost or decrease in production capacity, by calculating the mounting position accuracy at a stage during the mounting step, feeding this result back to the mounting position, and constantly and automatically calibrating and adjusting the mounting position.

Figure 9A:
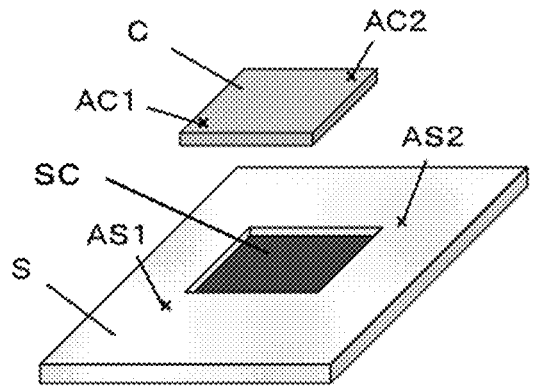
FIGS. 9A and 9B illustrate face-up mounting on an embedded substrate, with FIG. 9A showing a state in which the chip component has been separated from the substrate, and FIG. 9B showing a state in which the chip component has been positioned and mounted on the substrate.
Figure 9A:
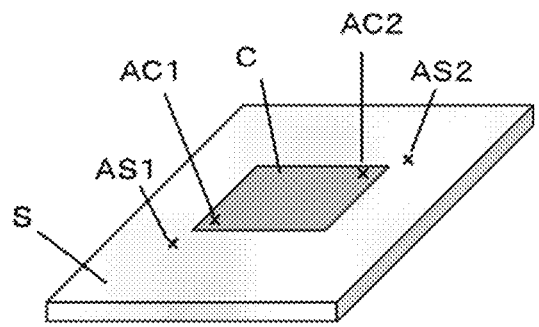
Figure 9A:
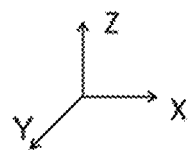
Figure 9B:
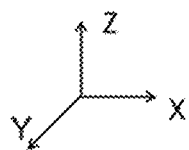
Figure 10A:
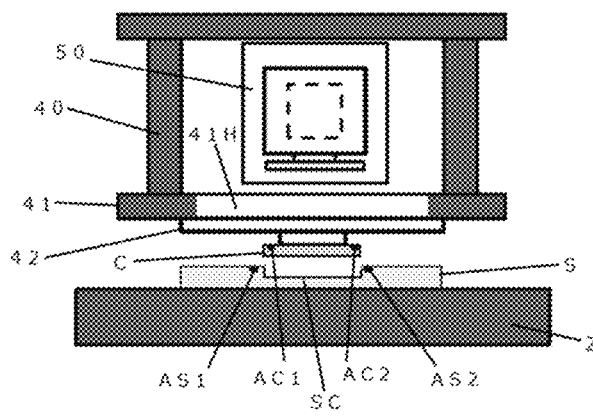
FIG. 10A is a diagram showing the state during the positioning of an embedded substrate and a chip component in the mounting device according to an embodiment of the present disclosure.
Figure 10A:
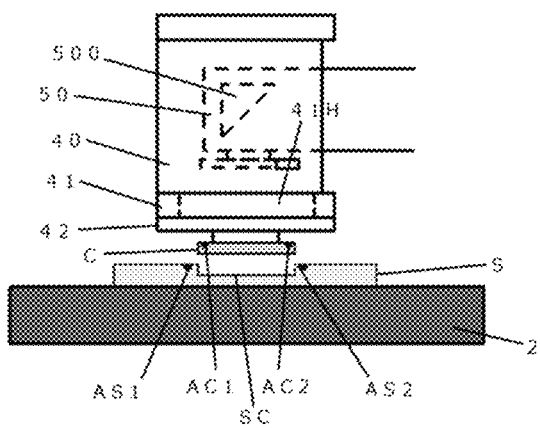
Figure 10A:
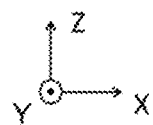
Figure 10B:
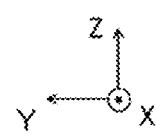
FIG. 10B is a diagram of this same state as viewed from the side surface direction.
Figure 11A:
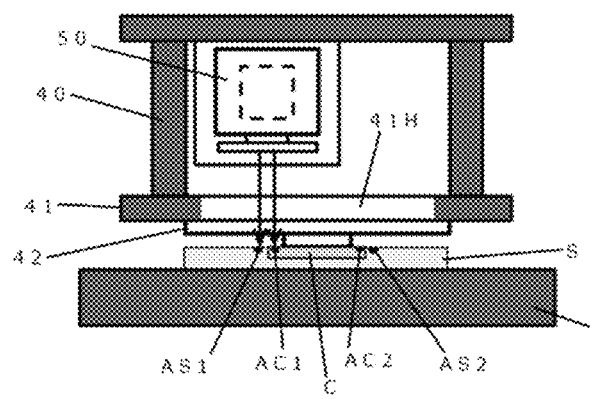
FIGS. 11A and 11B illustrate mounting position accuracy measurement during the mounting step in which a chip component is mounted on an embedded substrate in the mounting device according to an embodiment of the present disclosure, with FIG. 11A showing a state in which position information about the substrate first recognition mark and position information about the chip component first recognition mark are acquired simultaneously, and FIG. 11B being a diagram of this same state when viewed from the side surface direction.
Figure 11B:
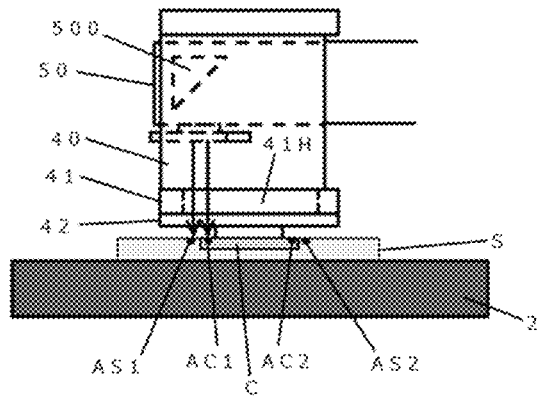
Figure 12A:
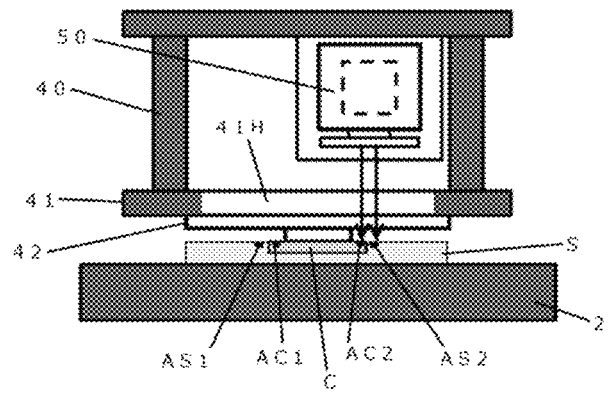
FIGS. 12A and 12B illustrate mounting position accuracy measurement during the mounting step in which a chip component is mounted on an embedded substrate in the mounting device according to an embodiment of the present disclosure, with FIG. 12A showing a state in which position information about the substrate second recognition mark and position information about the chip component second recognition mark are acquired simultaneously, and FIG. 12B being a diagram of this same state when viewed from the side surface direction.
Figure 12B:
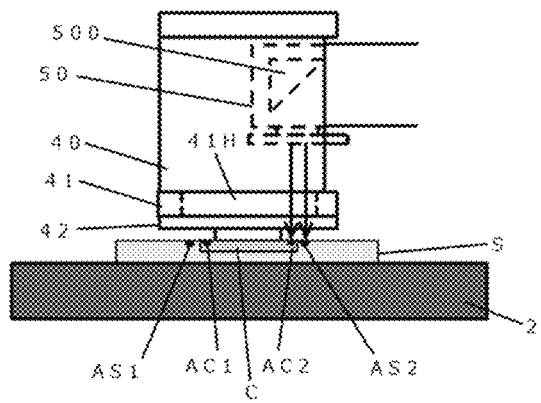
Figure 13A:
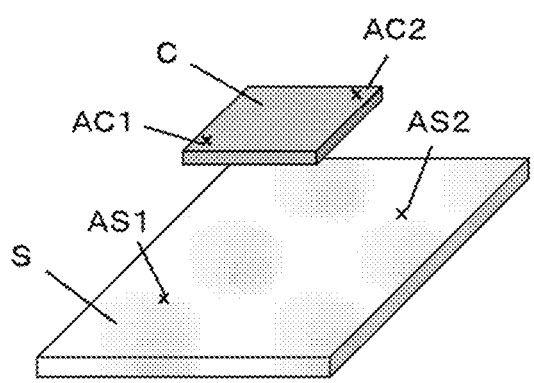
FIGS. 13A and 13B illustrate face-up mounting, with FIG. 13A showing a state in which the chip component has been separated from the substrate, and FIG. 13B showing a state in which the chip component has been positioned and mounted on the substrate.
Figure 13B:
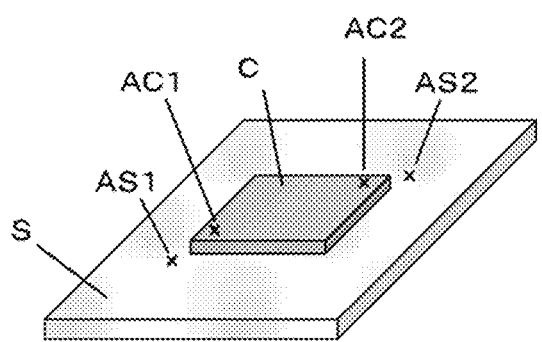
Figure 14A:
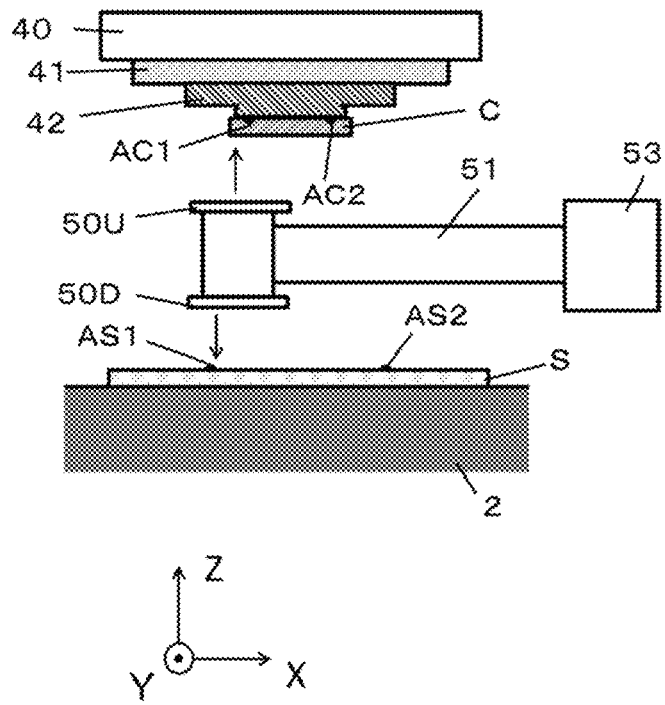
FIGS. 14A and 14B illustrate a comparative example of positioning in face-up mounting, with FIG. 14A showing an example of using an upper and lower two-field camera, and FIG. 14B illustrating the positional relationship between chip recognition marks and the corners of the chip.
Figure 14B:
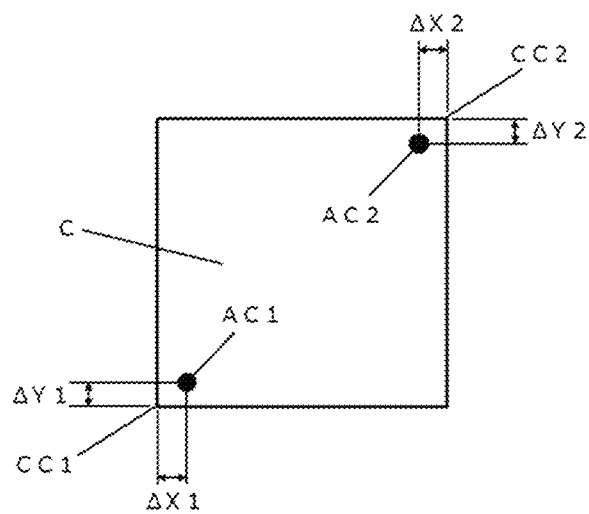
Figure 15A:
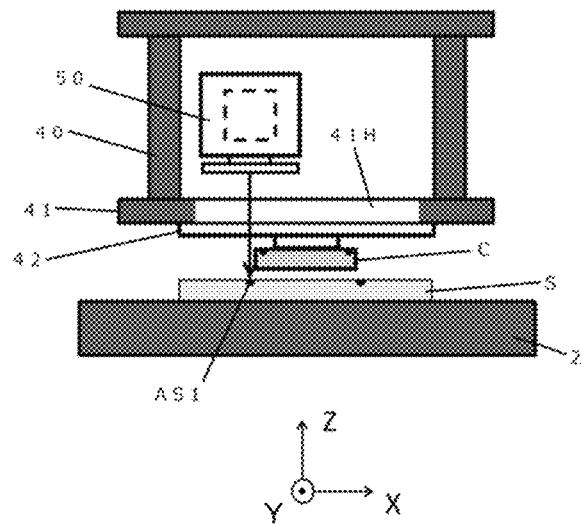
FIGS. 15A and 15B illustrate the positioning of a chip component and a substrate using a transparent member as an attachment tool for holding the chip component, with FIG. 15A showing a state in which position information about the substrate first recognition mark is acquired, and FIG. 15B showing a state in which this same state is viewed from the side surface direction.
Figure 15B:
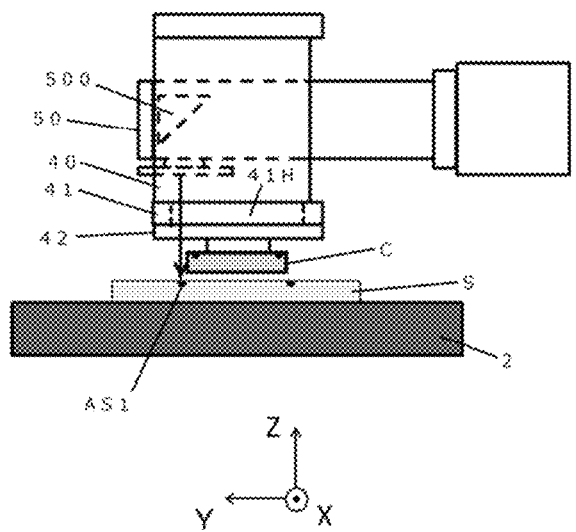
Figure 16A:
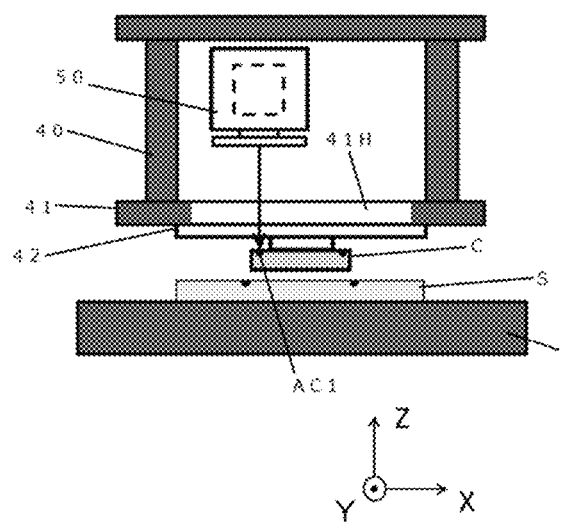
FIGS. 16A and 16B illustrate the positioning of a chip component and a substrate using a transparent member as an attachment tool for holding the chip component, with FIG. 16A showing a state in which position information about the chip component first recognition mark is acquired, and FIG. 16B showing a state in which this same state is viewed from the side surface direction.
Figure 16B:
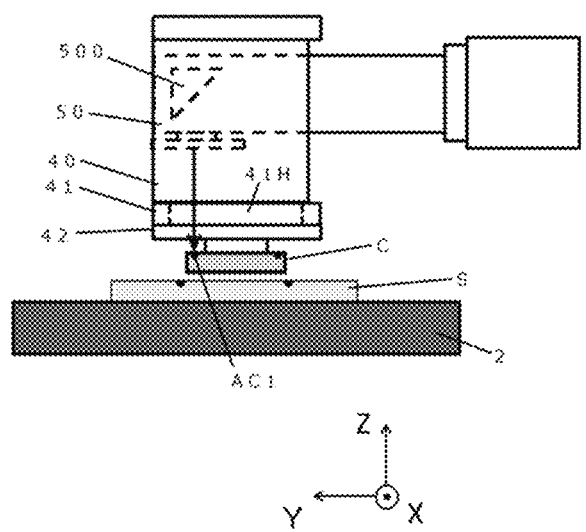
Figure 17A:
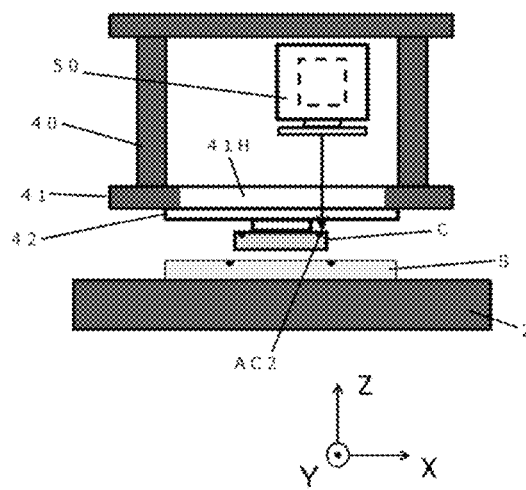
FIGS. 17A and 17B illustrate the positioning of a chip component and a substrate using a transparent member as an attachment tool for holding the chip component, with FIG. 17A showing a state in which position information about the chip component second recognition mark is acquired, and FIG. 17B showing a state in which this same state is viewed from the side surface direction.
Figure 17B:
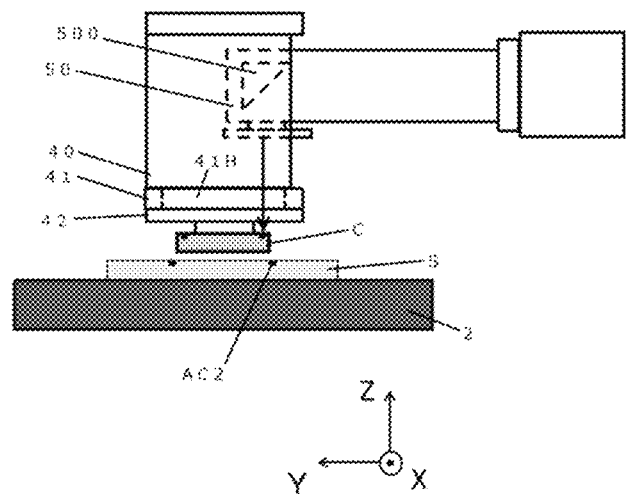
Figure 18A:
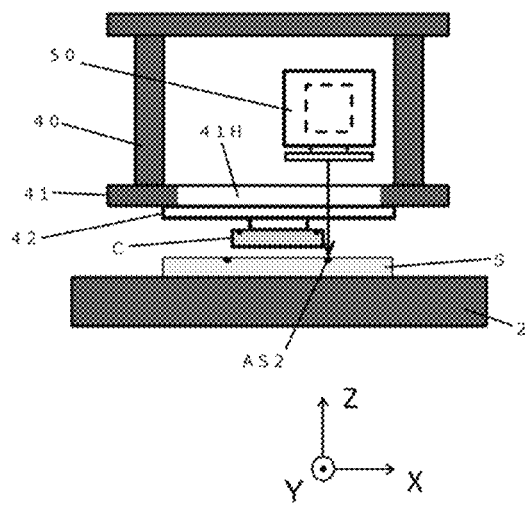
FIGS. 18A and 18B illustrates the positioning of a chip component and a substrate using a transparent member as an attachment tool for holding the chip component, with FIG. 18A showing a state in which position information about the substrate second recognition mark is acquired, and FIG. 18B showing a state in which this same state is viewed from the side surface direction.
Figure 18B:
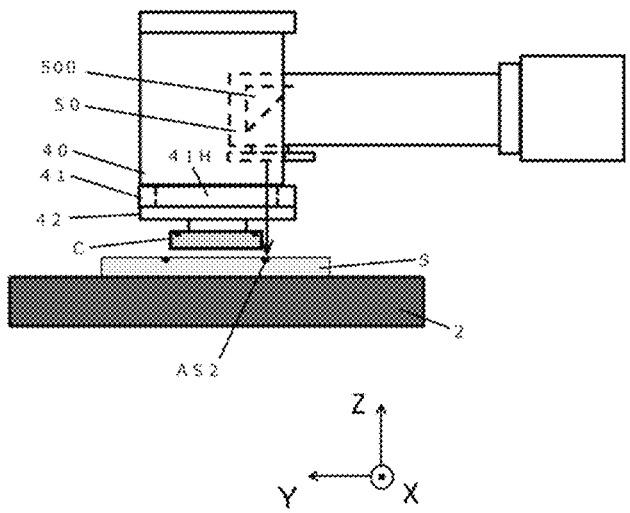

In mounting position accuracy measurement, the function of simultaneously imaging the substrate recognition marks and the chip recognition marks within the depth of focus and within the same field using either the imaging means 53a or the imaging means 53b is an extremely effective method for mounting the chip component C on a component-embedded substrate. That is, when the chip component C is mounted in a recess SC of the substrate S having this recess SC as shown in FIGS. 9A, 10A and 10B, the upper surface of the substrate S and the upper surface of the chip component C are substantially flush, as shown in FIG. 9B. Therefore, as shown in FIGS. 11A and 11B, the distances from the image capture unit 50 of the recognition mechanism to the substrate recognition first mark AS1 and to the chip recognition first mark AC1 are substantially the same vertical distance, and it will be easy to image both recognition marks simultaneously, in a focused state, and within the same field of view. This also applies to when the substrate recognition second mark A2 and the chip recognition second mark AC2 shown in FIGS. 12A and 12B are imaged.

Also, if the upper surface of the substrate S and the upper surface of the chip component C are flush, there will be zero height difference in the up and down direction between the substrate recognition marks and the chip recognition marks, and a clearer image can be acquired, so this is ideal for the function of ascertaining the change in the optical axis position and the optical axis inclination of the imaging means 53a and the imaging means 53b, the change in the inclination of the elevating and pressing unit 3, and so forth, and automatically and constantly performing calibration and adjustment of the mounting position. Furthermore, it is possible to realize a mounting device that affords good stability, high reliability, and high accuracy.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A mounting device for face-up mounting of a chip component having a positioning-use chip recognition mark and a substrate having a positioning-use substrate recognition mark, in an orientation in which the chip recognition mark and the substrate recognition mark are facing up, the mounting device comprising:

a substrate stage configured to hold the substrate;
a mounting head configured to hold the chip component;
an elevator configured to raise and lower the mounting head in a direction perpendicular to the substrate;
a recognition mechanism configured to recognize the chip recognition mark and the substrate recognition mark through the mounting head and from above the mounting head, the recognition mechanism being movable in an in-plane direction of a substrate surface of the substrate; and a control unit connected to the recognition mechanism, the control unit being configured to calculate an amount of misalignment between the chip component and the substrate from position information about the chip recognition mark and the substrate recognition mark obtained from the recognition mechanism, and configured to perform positioning by driving the mounting head and/or the substrate stage according to the amount of misalignment, the recognition mechanism having a chip recognition sensor configured to recognize the chip recognition mark and a substrate recognition sensor configured to recognize the substrate recognition mark, the chip recognition sensor and the substrate recognition sensor being independently provided so that focal positions thereof are different via a common optical axis path.

2. The mounting device according to claim 1, wherein the recognition mechanism is configured to simultaneously recognize the chip recognition mark and the substrate recognition mark while a center of an optical axis of the recognition mechanism is disposed at a position near a midpoint between the chip recognition mark and the substrate recognition mark.

3. The mounting device according to claim 2, wherein after lowering the mounting head holding the chip component in the direction perpendicular to the substrate to bring the chip component into close contact with the substrate subsequent to performing the positioning, the control unit is configured to cause the recognition mechanism to start a parallel recognition operation of the chip recognition mark and the substrate recognition mark and recognize the chip recognition mark and the substrate recognition mark through the mounting head in a mounted state in which the chip component is in close contact with the substrate, and configured to calculate mounting position accuracy of the chip component and the substrate.

4. The mounting device according to claim 3, wherein, during the parallel recognition operation of the chip recognition mark and the substrate recognition mark for calculating the mounting position accuracy that has been started after the chip component is brought into close contact with the substrate, the recognition mechanism is configured to use either the chip recognition sensor or the substrate recognition sensor to simultaneously recognize the chip recognition mark and the substrate recognition mark while the center of the optical axis of the recognition mechanism is disposed at the position near the midpoint between the chip recognition mark and the substrate recognition mark.

5. The mounting device according to claim 4, wherein the control unit is configured to feed back a calculation result of the mounting position accuracy to a mounting position to automatically calibrate and adjust the mounting position.

6. A mounting method in which a chip component having a positioning-use chip recognition mark is mounted on a substrate having a positioning-use substrate recognition mark, the method comprising:

positioning relative positional relation between the chip component and the substrate by recognizing, in a state where the chip component is disposed with a gap between itself and the substrate, the chip recognition mark and the substrate recognition mark simultaneously from a same direction through a mounting head by a recognition mechanism in which a chip recognition sensor for recognizing a chip recognition mark and a substrate recognition sensor for recognizing a substrate recognition mark are independently provided so that focal positions thereof are different via a common optical axis path;

mounting by bringing the chip component into close contact with the substrate and pressing; and measuring and inspecting mounting position accuracy by recognizing, in a mounted state in which the chip component is in close contact with the substrate, the chip recognition mark and the substrate recognition mark from the same direction through the mounting head, and by calculating the relative positional relation between the chip component and the substrate, after the chip component is in close contact with the substrate, the mounting and the measuring and inspecting of the mounting position accuracy being performed in parallel.

7. The mounting method according to claim 6, wherein during the measuring and inspecting of the mounting position accuracy, the recognition mechanism uses either the chip recognition sensor or the substrate recognition sensor to simultaneously recognize the chip recognition mark and the substrate recognition mark while a center of an optical axis of the recognition mechanism is disposed at a position near a midpoint between the chip recognition mark and the substrate recognition mark.

8. The mounting method according to claim 7, further comprising feeding back a calculation result of the mounting position accuracy calculated during the measuring and inspecting of the mounting position accuracy to a mounting position to automatically calibrate and adjust the mounting position.

* * * * *